United States Patent
Sripada

(10) Patent No.: US 7,216,317 B2
(45) Date of Patent: May 8, 2007

(54) HIERARCHICAL SIGNAL INTEGRITY ANALYSIS USING INTERFACE LOGIC MODELS

(75) Inventor: Subramanyam Sripada, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 380 days.

(21) Appl. No.: 10/818,844

(22) Filed: Apr. 5, 2004

(65) Prior Publication Data

US 2005/0229128 A1    Oct. 13, 2005

(51) Int. Cl.
*G06F 17/50*    (2006.01)
(52) U.S. Cl. .................... 716/6; 716/4; 716/5
(58) Field of Classification Search .......... 716/4–6
See application file for complete search history.

(56) References Cited

U.S. PATENT DOCUMENTS

| | | | | |
|---|---|---|---|---|
| 5,095,454 | A * | 3/1992 | Huang | 703/19 |
| 6,877,139 | B2 * | 4/2005 | Daga | 716/1 |
| 2004/0078767 | A1 * | 4/2004 | Burks et al. | 716/8 |
| 2004/0250224 | A1 * | 12/2004 | Clement et al. | 716/6 |
| 2005/0251775 | A1 * | 11/2005 | Wood | 716/10 |

OTHER PUBLICATIONS

Daga, Ajay J., et al. "Automated Timing Model Generation" DAC (Jun. 2002) New Orleans, LA, 6 pages.

* cited by examiner

*Primary Examiner*—Thuan V. Do
*Assistant Examiner*—Naum Levin
(74) *Attorney, Agent, or Firm*—Bever, Hoffman & Harms, LLP; Jeanette S. Harms

(57) ABSTRACT

Performing signal integrity (SI) analysis on integrated circuit designs is becoming increasingly important as these designs increase in size and complexity. Dividing a design into blocks can simplify the resulting analysis. Additionally, such blocks can be replaced with timing models, which provide a compact means of exchanging interface timing information for the blocks. To further increase the speed and accuracy of SI analysis, enhanced interface logic models (SI-ILMs) can be used. An SI-ILM can include cells in timing paths that serve as the interface between the block and other parts of the design. The SI-ILM can also include internal nets that have cross-coupling effects on interface nets and nets outside the block. By including these internal nets, SI analysis at the top-level can be both fast and accurate.

7 Claims, 9 Drawing Sheets

HIERARCHICAL SIGNAL INTEGRITY ANALYSIS USING INTERFACE LOGIC MODELS

BACKGROUND OF THE INVENTION

1. Field of the Invention

The present invention relates to signal integrity (SI) analysis performed in conjunction with static timing analysis of a hierarchical design, and particularly to using interface logic models (ILMs) in this SI analysis.

2. Description of the Related Art

Static timing analysis of complex circuits is a computationally expensive operation. Static timing analysis (STA) refers to a method of validating the timing performance of a design by checking all possible paths for timing violations. Unfortunately, when routing is performed for circuits in the design, the proximity of two nets could result in undesirable crosstalk in which a signal on one net could affect the timing of a signal on the other net.

An operation called signal integrity (SI) analysis can be performed in conjunction with STA to evaluate the dynamic effects of cross-coupling between proximate nets. Typically, SI analysis is addressed using physical synthesis (e.g. sizing of drivers, inserting buffers, optimizing placement of components, and isolating nets) and routing. Unfortunately, performing this SI analysis adds significant complexity to STA. Thus, accomplishing SI analysis on a full chip may be practically impossible. Moreover, even if SI analysis is possible, it takes an inordinate amount of time. For example, for complex designs, such as system-on-a-chip (SOC) designs, SI analysis could take many hours or even days to run.

Therefore, a need arises for a method of performing SI analysis that provides accurate and time efficient results.

SUMMARY OF THE INVENTION

Performing signal integrity (SI) analysis on integrated circuit designs is becoming increasingly important as these designs increase in size and complexity. Dividing a design into blocks, i.e. user— or system-defined hierarchies within the design, can allow SI analysis of blocks, thereby simplifying the resulting analysis. Additionally, such blocks can be replaced with timing models for performing SI analysis at the top-level design. These timing models can provide a compact means of exchanging interface timing information for the blocks.

In one embodiment, enhanced interface logic models (ILMs) can be used in SI analysis. ILMs can include cells in timing paths that serve as the interface between the block and other parts of the design. This interface portion can include combinational logic, edge-triggered registers, clock nets associated with these edge-triggered registers, and interface nets in the timing paths. Of importance, the enhanced ILM can further include any internal net (i.e. any net inside the block other than an interface net) that has a cross-coupling effect on an interface net. In one embodiment, the enhanced ILM can also include any internal net that has a cross-coupling effect on another net outside the block. By including these internal nets, SI analysis at the top-level that uses such ILMs can be both fast and accurate.

A method of performing hierarchical signal integrity (SI) analysis on a design using these enhanced ILMs is provided. In this method, the design can be divided into blocks. At this point, a block-level analysis for a block can be performed using cross-coupling effects on the block. In one embodiment, performing the block-level analysis can include determining a cross-coupling effect of an interface net in the block on an internal net of the block. Performing the block-level analysis can further include determining a cross-coupling effect of an external net to the block on an internal net of the block. This block-level analysis generates the enhanced ILM, which is called an SI-ILM. Advantageously, a top-level analysis for the block can then be performed using the SI-ILM.

Performing the block-level analysis can further include annotating arrival times and transition times for the external nets of the block. Initially, the arrival time can be defined as infinite and the transition time can be defined as zero. In subsequent analysis, revised arrival/transition times can be computed based on the top-level SI analysis. These revised arrival/transition times can be used when re-performing the block-level analysis.

In accordance with another aspect of the invention, a method of generating a block model for SI analysis is provided. The method can include generating an ILM for the block and adding identified internal nets of the block to the ILM. Generating the ILM can include determining certain cells of the block, e.g. cells in a timing path that starts at an input port and ends at an output port, cells in a timing path that starts at an input port and ends at an edge-triggered register, and cells in a timing path that starts at an edge-triggered register and ends at an output port. The ILM can also include clock trees driving edge-triggered registers that form part of the ILM.

Of importance, the identified internal nets are affected by cross-coupling. For example, adding the identified nets can include determining a cross-coupling effect of an internal net in the block on an interface net of the block. Adding identified nets can further include determining a cross-coupling effect of an internal net to the block on an external net of the block. In other words, any internal nets of the block necessary for crosstalk analysis can be added to the ILM, thereby ensuring accuracy of the model. Adding these identified internal nets to the ILM can provide improved SI analysis at the top-level.

In accordance with another aspect of the invention, a method of performing SI analysis of a design with shielded blocks is provided. A shielded block, by definition, is a block where there is no cross-coupling between nets in the block to external nets (e.g. top-level nets or nets in other blocks). The method can include receiving design and parasitic information regarding the block. An SI-ILM can be generated using this design and the parasitic information. Note that the SI-ILM includes fewer cells than provided in the design information. The SI-ILM may include at least one internal net cross-coupled to an interface net in the block. Note that because the block is shielded, there cannot be effects from nets external to the block on any internal or interface nets in the block (and vice versa). At this point, top-level analysis of the block can be performed using the SI-ILM.

A method of performing SI analysis of a design with non-shielded blocks is also provided. A non-shielded block can have cross-coupling between nets in the block to external nets (e.g. top-level nets or nets in other blocks) can exist. In this method, design and parasitic information is received. The design can be divided into blocks. For each block, a "wrapper cell" can be generated. In one embodiment, the wrapper cell can include block information, an SI context for the block, and parasitic information for the SI context and the block. The SI context can include nets external to the block that are cross-coupled to internal nets or interface nets of the block.

An SI-ILM can be generated using this wrapper cell. Notably, the SI-ILM may include internal nets cross-coupled to nets external to the block. At this point, a top-level analysis of the block can be performed using the SI-ILM. The wrapper cell can also be used to generate annotation scripts for the SI-ILM. These annotation scripts can then be used in performing the top-level design analysis.

In one embodiment, dividing the design into blocks can include generating a top-level cell description. This top-level cell description can uniquely identify blocks having multiple instantations. The top-level cell description can be used when performing the top-level analysis.

In one embodiment, if a violation occurs when performing block-level analysis, then a revised block-level analysis can be performed by re-annotating the wrapper cell using the results from top-level analysis. This analysis can be further used to regenerate annotation scripts of the SI-ILM. Top-level analysis of the design can be performed using the revised SI-ILM.

In accordance with another aspect of the invention, an enhanced ILM that facilitates accurate SI analysis is provided. The enhanced ILM can include the interface logic of the block. In one embodiment, the interface logic can include cells in a timing path that starts at an input port and ends at an output port, cells in a timing path that starts at an input port and ends at an edge-triggered register, and cells in a timing path that starts at an edge-triggered register and ends at an output port. The interface logic can further include any clock tree driving an edge-triggered register forming part of the interface logic.

Of importance, the enhanced ILM can include an internal component of the block. This internal component can include an internal net cross-coupled to an interface net that forms part of the interface logic and/or an external net of the block, drivers associated with the internal net, and load cells associated with the internal net. In one embodiment, the enhanced ILM can further include an arrival time and a transition time annotated at an input pin of the driver cells.

In accordance with another aspect of the invention, a software program can include a first set of instructions for dividing the design into blocks. A second set of instructions can perform a block-level analysis for a block using cross-coupling effects on the block, thereby generating an SI-ILM. A third set of instructions can advantageously perform a top-level analysis for the block using the SI-ILM.

The second set of instructions for performing the block-level analysis can include instructions for determining a cross-coupling effect of an interface net in the block on an internal net of the block. The second set of instructions for performing the block-level analysis can further include instructions for determining a cross-coupling effect of an external net to the block on an internal net of the block.

Other aspects, features, and advantages of the invention will now be described in reference to various embodiments.

DETAILED DESCRIPTION OF THE FIGURES

Performing signal integrity (SI) analysis on complex designs is becoming increasingly difficult. To simplify the task of analysis, a complex design can be divided into blocks, i.e. any user— or system-defined hierarchies within a chip. At this point, the blocks can be replaced with timing models. Advantageously, timing models can provide a compact means of exchanging the interface timing information for the blocks. Some SI analysis tools, such as the Prime-Time®-SI licensed by Synopsys, Inc., can automatically generate timing models from the gate-level netlist for a design.

The use of timing models in place of the full gate-level netlist for a block is key to improving performance and capacity associated with chip-level SI analysis, particularly for complex designs whose gate counts exceed 5 million gates. Moreover, timing models can preserve information required to verify block integration in the design.

Automatic model generation can include the use of interface logic models (ILMs). ILMs discard the netlist, constraints, and back-annotation associated with internal register-to-register paths on a design, thereby offering significant runtime and performance improvements without sacrificing accuracy. Moreover, an ILM contains only interface logic of the original netlist. For example, logic that is only contained in register-to-register paths on a block is not placed in an ILM.

In one embodiment, the following interface logic can be defined as belonging to an ILM.

(1) Cells (i.e. combinational logic and associated nets (called interface nets herein)) contained in a timing path that starts at an input port and ends at either an edge-triggered register (i.e. sequential logic) or an output port. If a transparent latch is encountered in such a timing path, then it is treated as combinational logic and path tracing continues through the latch until an edge-triggered register or output port is encountered.

(2) Cells contained in a timing path that starts at an edge-triggered register and ends at an output port. Encountered transparent latches are handled as described in (1).

(3) Clock trees driving edge-triggered registers in the ILM.

Figure 1A:
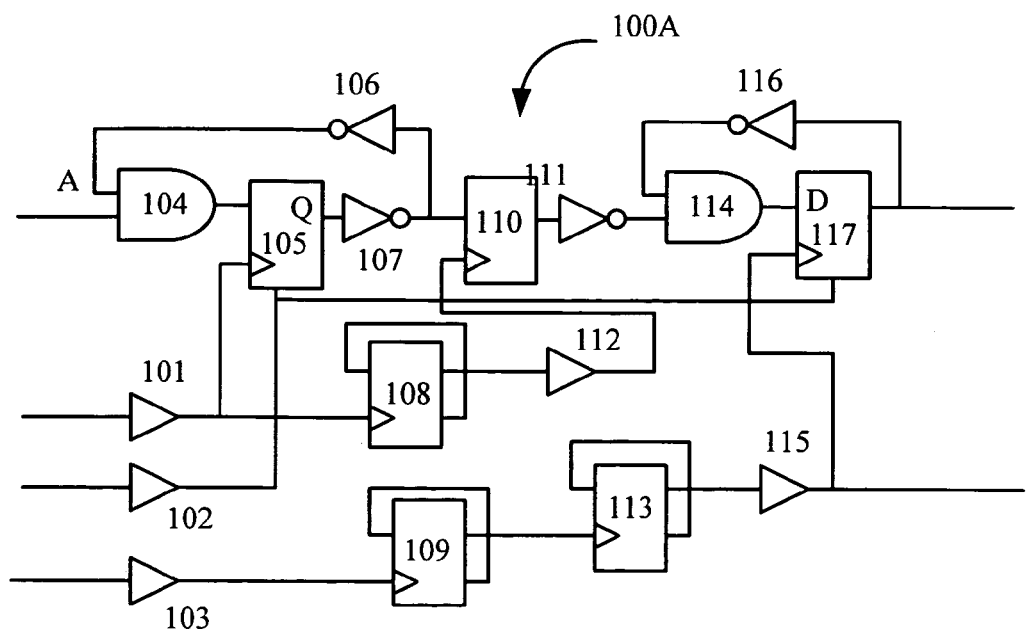
FIG. 1A shows a gate-level netlist for an exemplary block.
Figure 1B:
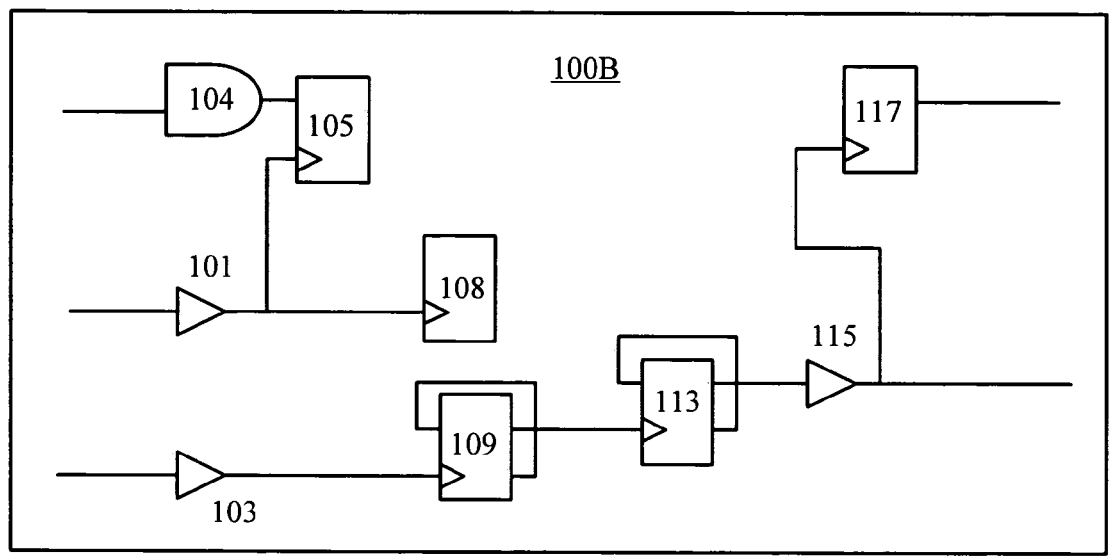
FIG. 1B illustrates the interface logic model (ILM) for the netlist of FIG. 1A.

FIG. 1A shows an example gate-level netlist 100A for an exemplary block whereas FIG. 1B illustrates the interface logic model (ILM) 100B of netlist 100A. Note that inverters 106, 107, 111, 116, buffer 112, edge-triggered register 110, and AND gate 114 are only instantiated in register-to-register paths and therefore are not part of ILM 100B. In contrast, AND gate 104, and edge-triggered register 105 are part of ILM 100B because they are contained in a timing path starting at an input port of the block and ending at edge-triggered register 105. Note that in ILM 100B, the input terminal A of AND gate 104 and the Q output terminal on edge-triggered register 105, both of which belong to a register-to-register paths, are disconnected.

Edge-triggered register 117 is contained in a timing path and ends at an output port and therefore is part of ILM 100B. Note that the D input terminal on edge-triggered register cell 117 belongs to a register-to-register path and therefore is disconnected in ILM 100B.

Buffer 102 is not part of a timing path and therefore is not part of ILM 100B. In contrast, buffers 101 and edge-triggered registers 108 and 109 are part of ILM 100B because they are in the clock tree. Buffer 115 and an edge-triggered register 113 are part of ILM 100B because they are contained in a timing path starting at edge-triggered register 113 and ending at an output port of the block (buffer 115 and edge-triggered register 113 are also part of the clock tree driving edge-triggered register 117). Note that the feedback paths of edge-triggered registers 109 and 113 as well as the internal net between edge-triggered registers 109 and 113 are part of the clock tree that ultimately drives the clock of edge-triggered register 117 and therefore are included in ILM 100B. Further note that the net driving the clock terminal of edge-triggered register 117 is included as part of the clock tree driving an edge-triggered register forming part of ILM 100B.

In one embodiment, for designs including transparent latches, the maximum number of levels of latch "borrowing" in I/O paths can be specified. A latch is defined to be borrowing if the data signal of the latch comes in the transparency window of the latch. By default, transparent latches can be viewed substantially as combinational logic. That is, the fanout or fanin traversal continues through a transparent latch until an edge-triggered register is encountered. When the number of levels of latch borrowing is specified, the fanout or fanin traversal instead stops at a transparent latch whose level is greater than the specified borrowing level. Thus, specifying one level of latch borrowing, for example, results in the first two transparent latches encountered in an I/O path being part of the ILM. The first transparent latch can borrow, while the second transparent latch can function as an edge-triggered register that does not borrow.

Thus, as shown with respect to netlist 100A and ILM 100B, the internal nets (i.e. nets other than interface nets) of the block are eliminated. Notably, the elimination of these internal nets may cause failures or even loss of performance inside the block, in other blocks, or in the top-level design. For example, when global routing is performed for circuits in the design, the proximity of a global net external to the block and an internal net could result in cross-coupling that leads to undesirable effects like crosstalk (i.e. a signal on one net affecting the speed of the signal on the other net), thereby affecting the timing of one or both nets. Note that crosstalk can also affect two nets in different, proximate blocks.

The above-described ILMs can be advantageously enhanced for SI analysis. Specifically, enhanced ILMs can retain the above-described interface logic and further include the internal nets (and associated drivers and load cells) affected by cross-coupling. This enhanced ILM is called an SI-ILM hereinafter.

Figure 2A:
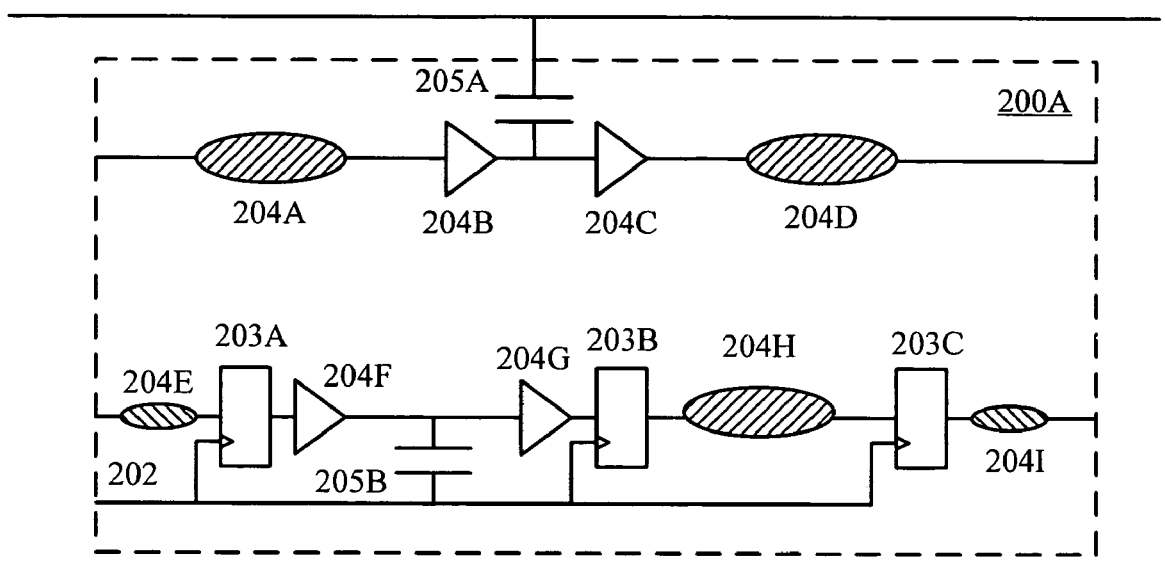
FIG. 2A illustrates a gate-level netlist for another exemplary block.

FIG. 2A illustrates a gate-level netlist 200A for an exemplary block having a top-level net 201. Note that netlist 200A includes both edge-triggered registers 203A–203C and combinational logic 204A–204I. Cross-coupling between an internal net in the exemplary block to top-level net 201 is identified by a capacitor 205A. Similarly, cross-coupling between another internal net in the block to an interface net 202 is identified by a capacitor 205B. In one embodiment, cross-coupling can be identified based on the proximity of the two nets, the shape of the routes, the power and ground rails, and the materials.

Figure 2B:
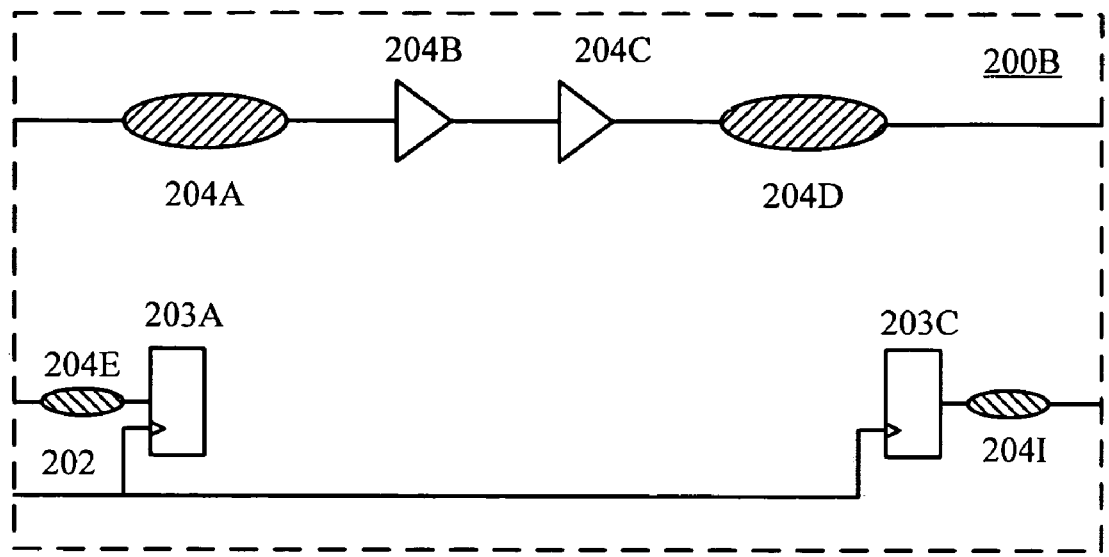
FIG. 2B illustrates an ILM for the netlist of FIG. 2A.

FIG. 2B illustrates an ILM 200B for netlist 200A in accordance with the above-described rules. Note that combinational logic 204A–204D are contained in a timing path that starts at an input port and ends at an output port and therefore are included in ILM 200B. Combinational logic 204E and edge-triggered register 203A are contained in a timing path starting at an input port and ending at edge-triggered register 203A and therefore are also included in ILM 200B. Combinational logic 204I and an edge-triggered register 203C are contained in a timing path starting at edge-triggered register 203C and ending at an output port and therefore are also included in ILM 200B.

Figure 2C:
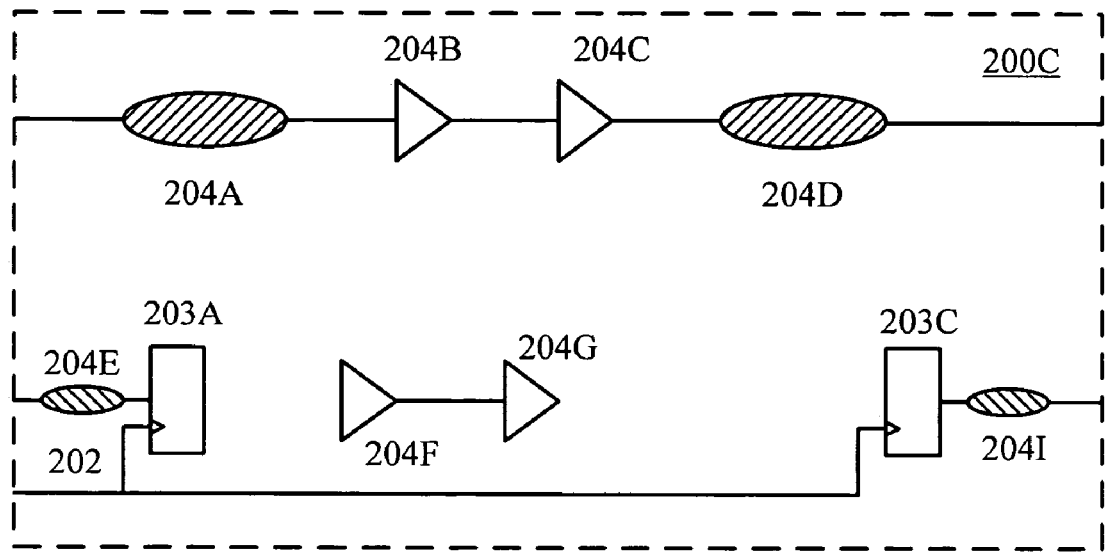
FIG. 2C illustrates an enhanced ILM, called an SI-ILM, for the netlist of FIG. 2A.

FIG. 2C illustrates an SI-ILM 200C for netlist 200A. As described previously, an SI-ILM is an enhanced ILM and therefore at minimum includes the interface logic of the ILM. Of importance, any internal net that results in cross-coupling with an interface net and/or an external net could also be included in an SI-ILM (as well as the driver and the load cell of that internal net). Therefore, with regards to netlist 200A, combinational logic 204F (i.e. the driver) and 204G (i.e. the load cell) as well as the internal net there between would be included in SI-ILM 200C, thereby ensuring that the effects of cross-coupling between this internal net and interface net 202 can be effectively addressed during a top-level analysis.

In accordance with one aspect of the invention, the addition of an internal net (and its associated driver and load cell) to an SI-ILM depends on the type of SI analysis to be performed. Note that combinational logic 204A–204D would be included in SI-ILM 200C irrespective of cross-coupling issues.

Figure 3A:
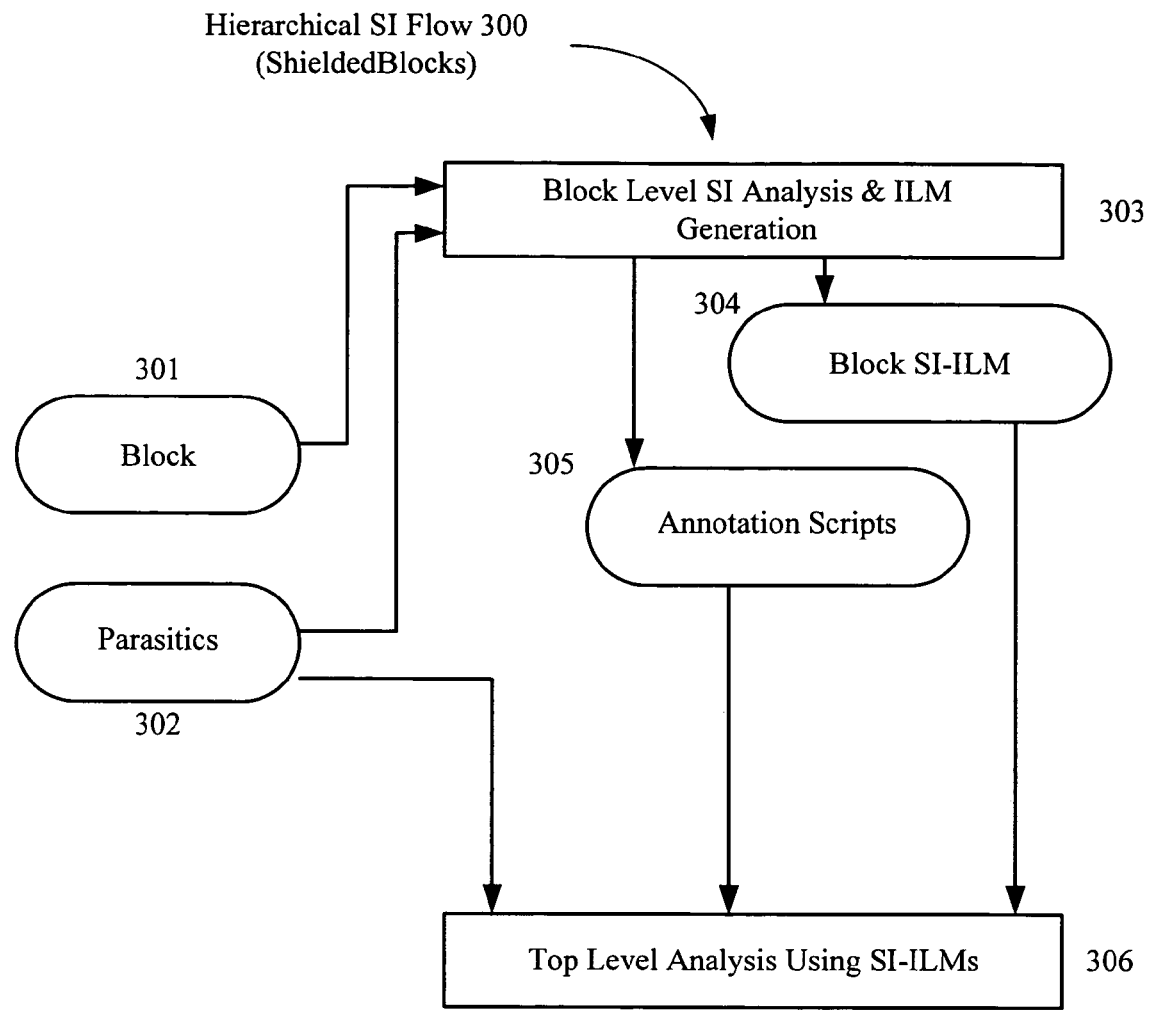
FIG. 3A illustrates a hierarchical signal integrity (SI) analysis flow for a design with shielded blocks that can use SI-ILMs in its top-level analysis.

FIG. 3A illustrates a hierarchical SI analysis flow 300 that can use SI-ILMs in its top-level analysis. Flow 300 is "shielded", i.e. SI analysis is being performed for a block that is completely shielded from other blocks as well as from top-level routing. In one embodiment of SI analysis flow 300, step 303 can perform block level SI analysis using block information 301 and its associated parasitic information 302. Using this information, block-level SI analysis can determine the effects of cross-coupling between internal nets and interface nets.

Figure 3B:
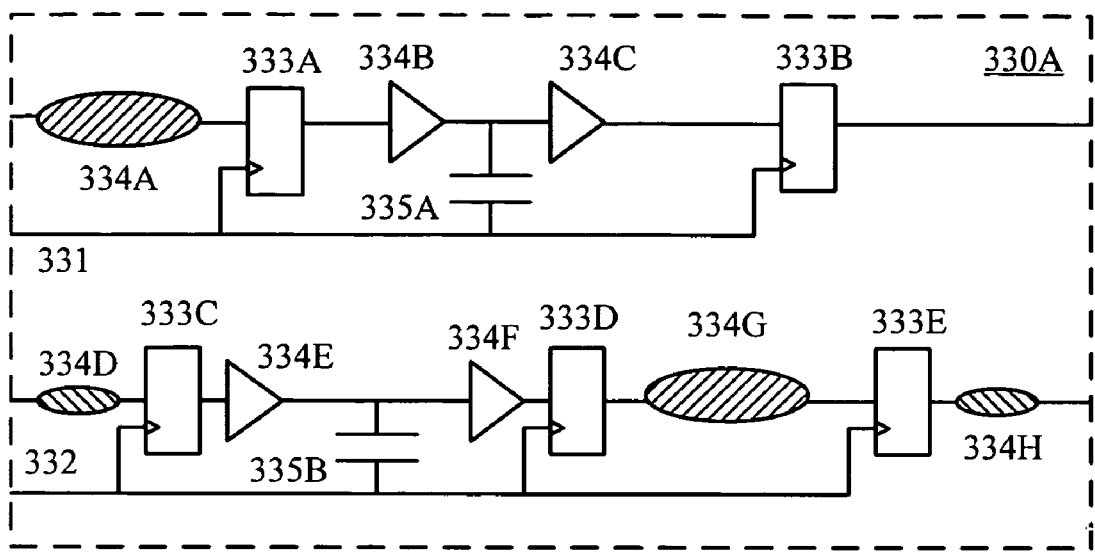
FIGS. 3B and 3C illustrate a netlist and its corresponding SI-ILM, respectively, assuming an SI analysis for shielded blocks (see FIG. 3A). For a shielded block, cross-coupling to either the top-level nets or nets in other blocks cannot exist. Therefore, in this SI analysis, only the effects of cross-coupling between internal nets and interface nets are used.
Figure 3C:
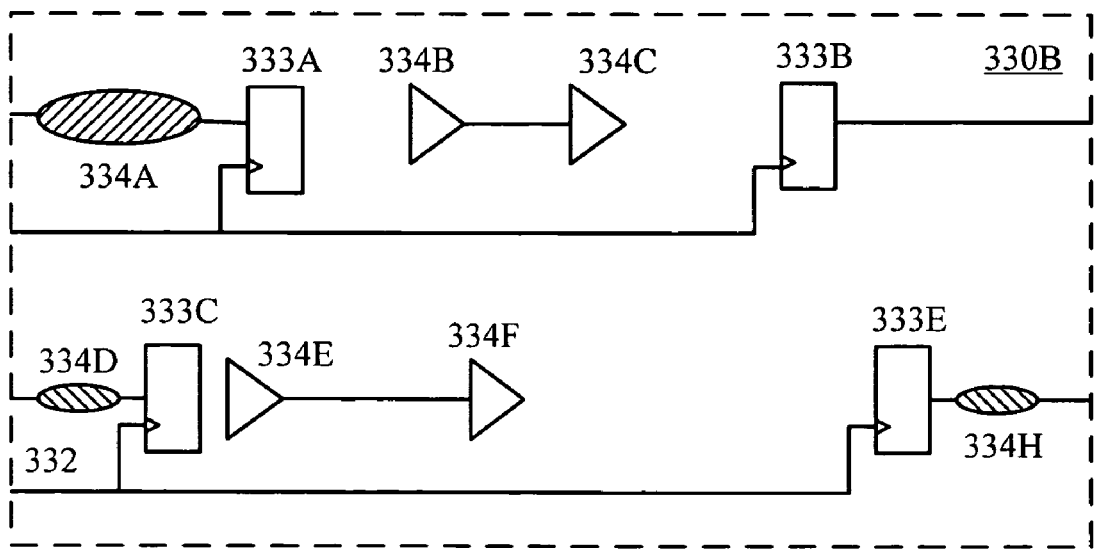

FIGS. 3B and 3C respectively illustrate a netlist and an SI-ILM of a shielded block. Netlist 330A includes both edge-triggered registers 333A–333E and combinational logic 334A–334H. Cross-coupling between an internal net in the block to an interface net 332 is identified by a capacitor 335A.

FIG. 3C illustrates an SI-ILM 330B for netlist 330A. Combinational logic 334A and an edge-triggered register 333A are contained in a timing path starting at an input port and ending at edge-triggered register 333A and therefore are included in SI-ILM 330B. Edge-triggered register 333B is contained in a timing path and ends at an output port and therefore is also included in SI-ILM 330B. Combinational logic 334D and an edge-triggered register 333C are contained in a timing path starting at an input port and ending at edge-triggered register 333C and therefore are also included in SI-ILM 330B. Combinational logic 334H and an edge-triggered register 333B are contained in a timing path that starts at edge-triggered register 333B and ends at an output port and therefore are also included in SI-ILM 330B. Net 332 is a clock net for edge-triggered registers 333C and 333E (which are interface logic) and therefore is included in SI-ILM 330B.

In addition to the above interface logic, SI-ILM 330B also includes the internal net between combinational logic 334B (i.e. the driver) and 334C (i.e. the load cell) because of the effect of cross-coupling between that internal net and interface net 331. Similarly, SI-ILM 330B further includes the internal net between combinational logic 334E (i.e. the driver) and 334F (i.e. the load cell) because of the effect of cross-coupling between that internal net and interface net 332.

Therefore, referring back to FIG. 3A, step 303 can generate the SI-ILM 304 (which includes the interface logic and the internal logic affected by cross-coupling to interface nets) and annotation scripts 305. In one embodiment, annotation scripts 305 can include arrival and transition times annotated at the input pin of the driver (e.g. combinational logic 334E in FIG. 3C). Note that the arrival and transition times of the other combinational logic and of the edge-triggered registers in the SI-ILM can be computed in the top-level analysis step and therefore do not need to be included in annotation scripts 305.

At this point, step 306 can then advantageously perform the top-level SI analysis by using the SI-ILM. Using the SI-ILM instead of an equivalent block (e.g. the block described by netlist 330A in FIG. 3B) significantly accelerates the speed of performing the top-level SI analysis while ensuring accuracy. Specifically, the less combinational logic in the block (and hence the less interface logic in the SI-ILM) the faster the SI analysis can be performed. Notably, because of the additional information about internal nets affected by cross-coupling, the SI-ILM can advantageously ensure accurate top-level analysis of the block. Note that this top-level SI analysis can also use annotation scripts 305 and parasitic information 302, thereby further enhancing the accuracy of this analysis.

Note that the cross-coupling effect can be described in relation to the level of analysis being performed. For example, in step 303, the effect of the interface net on the internal net is important. This effect can be described as the internal net being the "victim" and the interface net being the "aggressor". However, in step 306, the effect of the internal net on the interface net is important. This effect can be described as the internal net being the aggressor and the interface net being the victim.

In one embodiment, annotations regarding an internal net can be placed at the input pins of the driver cells of the aggressor net. For example, step 303 could generate annotation scripts 305 including annotations at the input pins of the driver cells of the internal nets as aggressors. In this manner, step 306 can use annotation scripts 305 to accurately determine the top-level analysis.

Hierarchical SI analysis can also be performed in a non-shielded flow. Non-shielded flow applies when a block is analyzed in conjunction with other blocks as well as top-level routing. In one embodiment of a non-shielded SI flow, an SI-context can be used to facilitate this SI analysis. Specifically, an SI-context is created to emulate the effect of full-chip on the block.

Figure 4A:
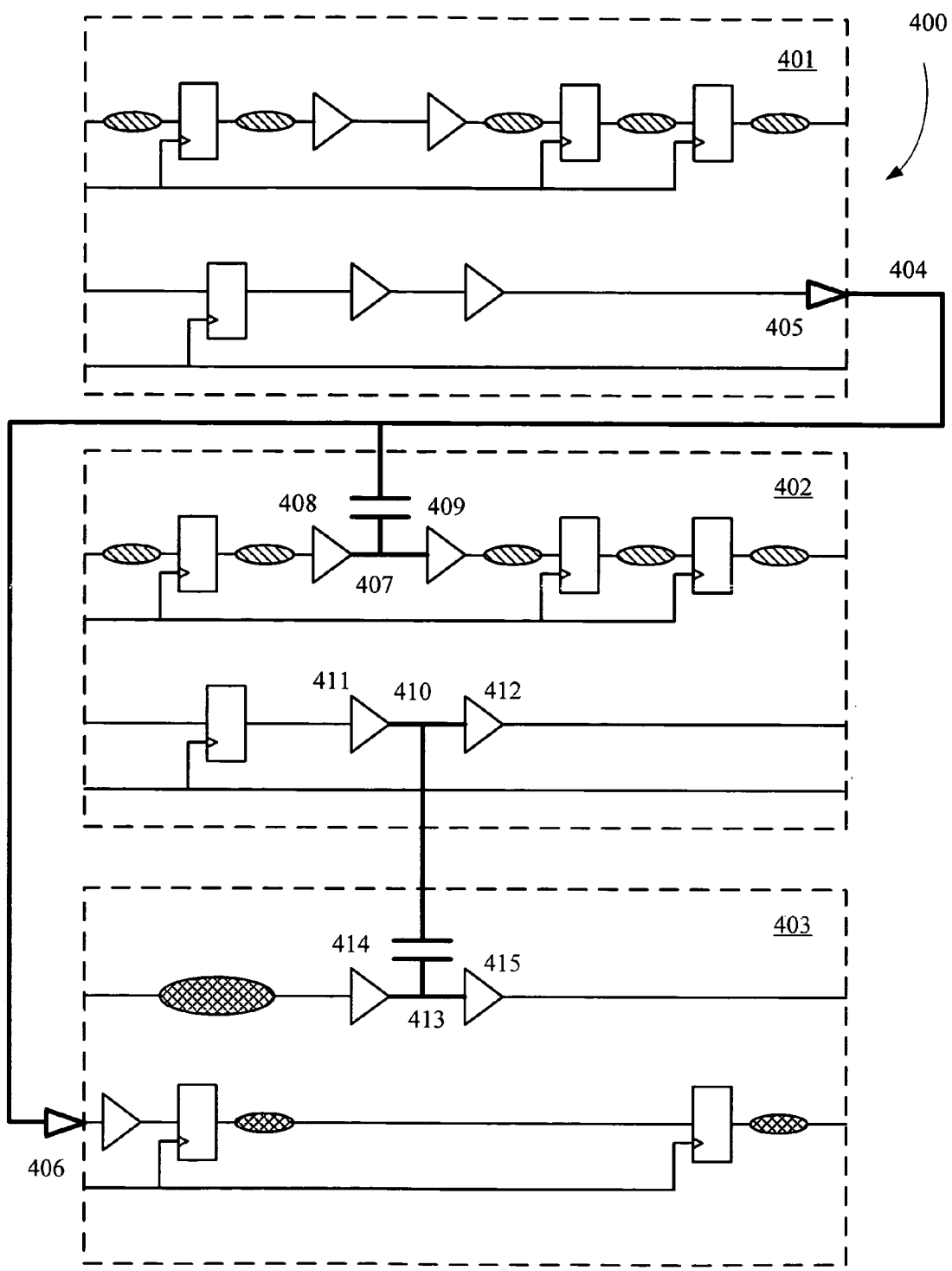
FIGS. 4A and 4B illustrate generating an SI-context using an exemplary design.
Figure 4B:
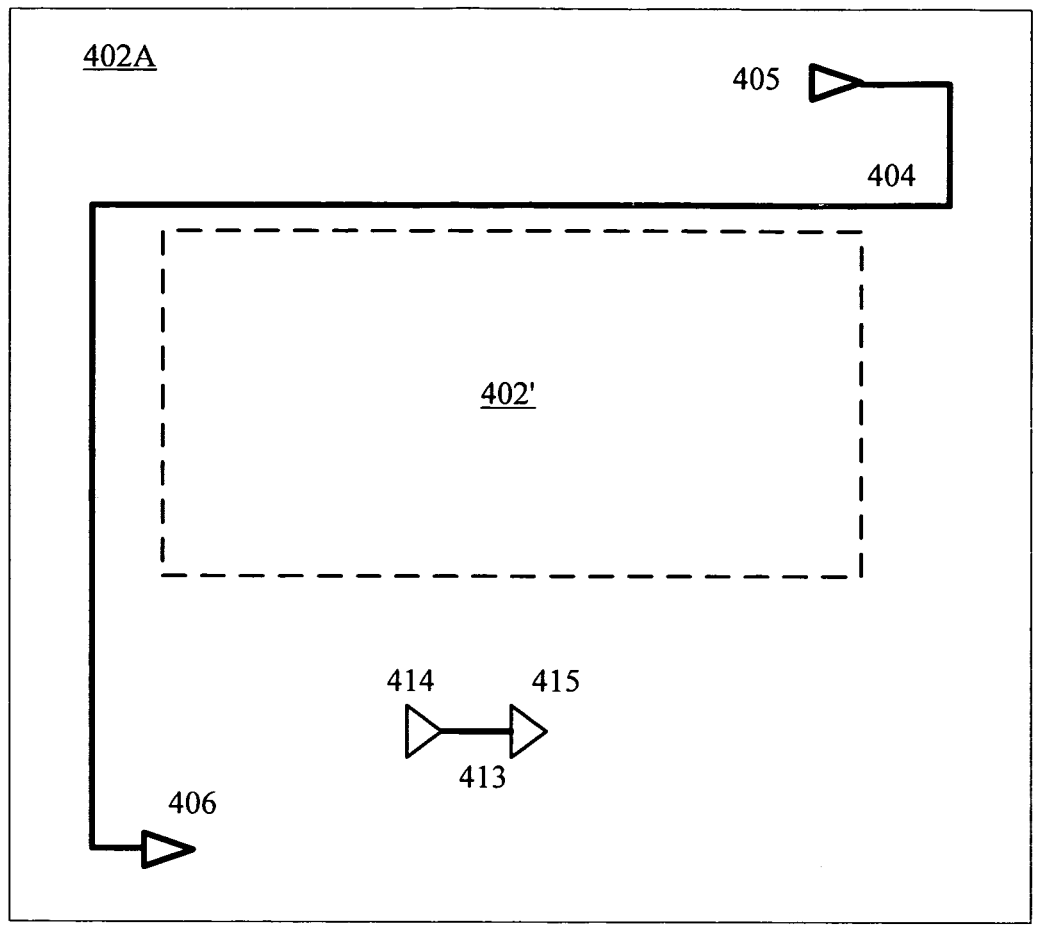

FIGS. 4A and 4B illustrate generating an SI-context using an exemplary design. FIG. 4A illustrates a simplified design 400 including three blocks 401, 402, and 403. Note that blocks 401 and 402 can be instantiations of the same block. Design 400 further includes a top-level net 404 having a driver 405 in block 401 and a load cell 406 in block 403. In design 400, cross-coupling occurs between an internal net 407 of block 402 and top-level net 404 as well as between an interface net 410 of block 402 and an interface net 413 of block 403. Note that cross-coupling between internal nets from different blocks can also be identified, if present.

Figure 4C:
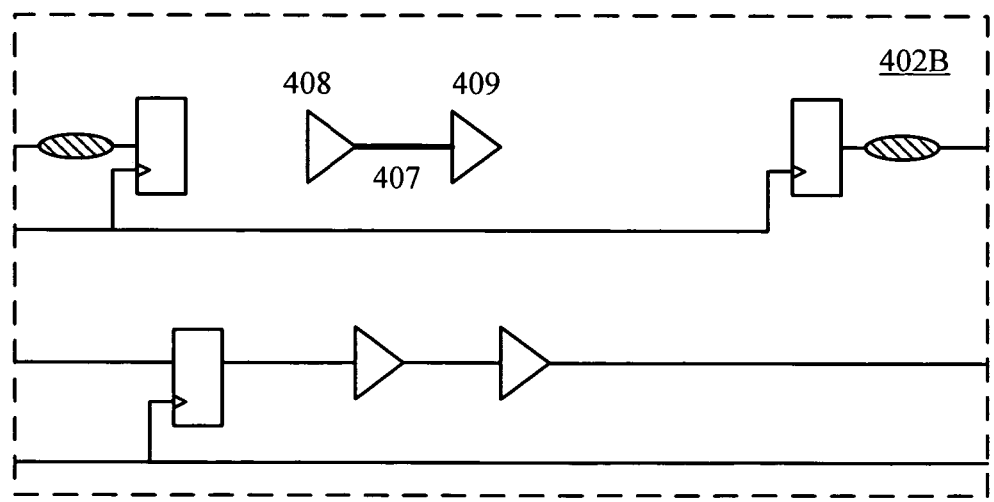
FIG. 4C illustrates an SI-ILM for a block in the design of FIG. 4A.

FIG. 4B illustrates an SI-context 402A for block 402. Specifically, SI-context 402A can include top-level net 404 (and its associated driver 405 and load cell 406), an instantiated block 402' (corresponding to block 402), and net 413 (and its associated driver 414 and load cell 415). FIG. 4C illustrates an SI-ILM 402B for block 402. Note that because block 402 is non-shielded, SI-ILM 402B includes, in addition to the interface logic that would be in an ILM (shown, but not labeled), net 407 (and its associated driver cell 408 and load cell 409).

Figure 4D:
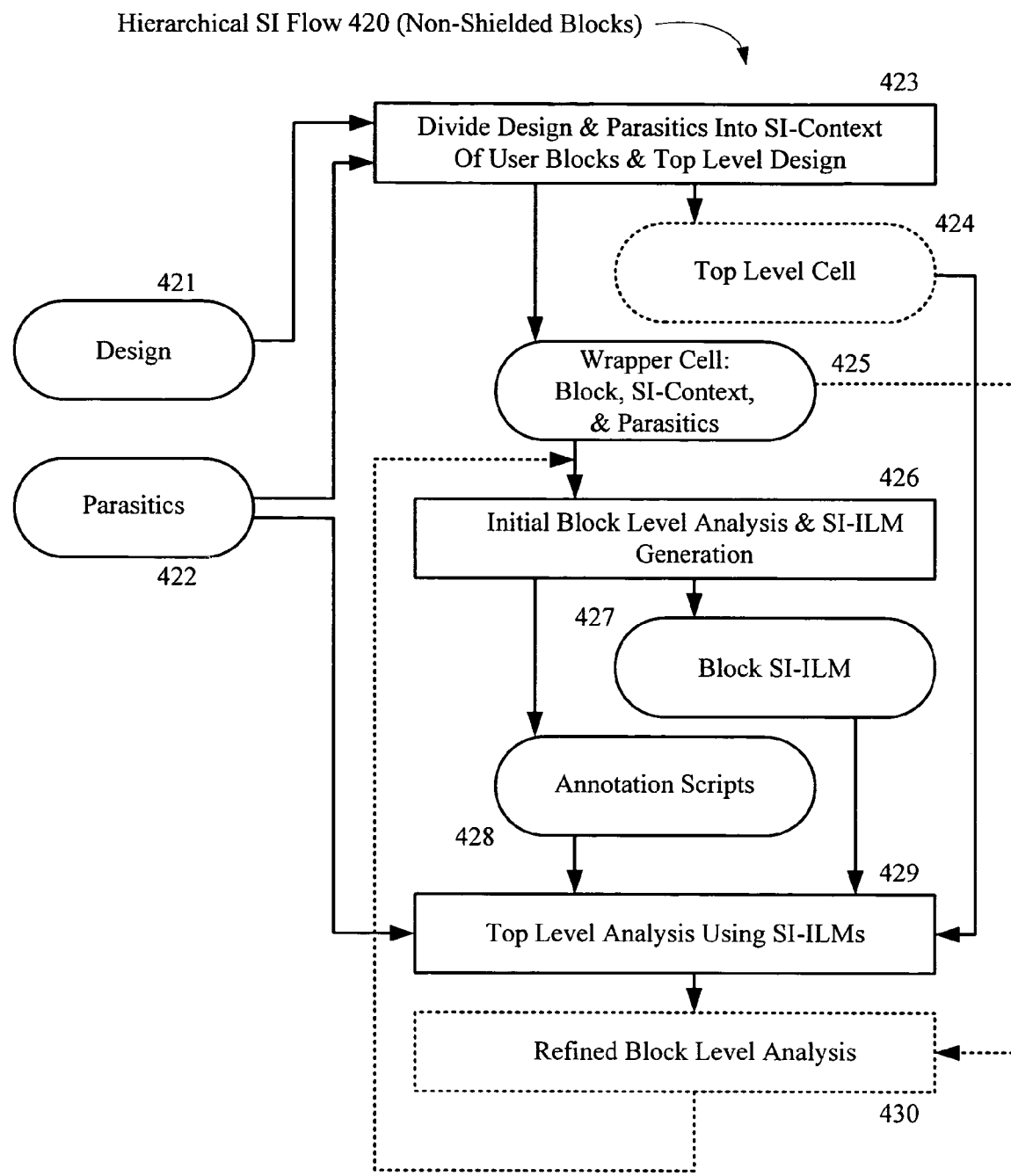
FIG. 4D illustrates an exemplary hierarchical SI analysis flow for non-shielded blocks that can use the SI-context to generate the SI-ILM of FIG. 4C.

FIG. 4D illustrates an exemplary hierarchical SI flow 420 for non-shielded blocks that can use the SI-context (e.g. SI-context 402A in FIG. 4B) to generate an SI-ILM (e.g. SI-ILM 402B). In step 423, design information 421 and parasitic information 422 associated with design 423 can be loaded. Using the design information 421 and parasitic information 422, step 423 can generate a "wrapper cell" 425. Wrapper cell 425 can include block information, the SI-context, and block/wrapper parasitic information. Note that parasitic information can be generated by any parasitic extraction tool, such as the Star-RCXT™ tool licensed by Synopsys, Inc. Logically, generating the SI-context for non-shielded blocks requires data about nets external to the block, therefore requiring the use of design information 421 (in contrast to only block information, e.g. block information 301 of FIG. 3A, used for shielded blocks).

Step 423 can also optionally generate a top-level cell 424 for each block. This step can be particularly beneficial for designs having multiple instantiations of the same block (see, e.g. FIG. 4A in which blocks 401 and 402 are instantiations of the same block). Top-level cell 424 can uniquely identify blocks having multiple instantiations to ensure that each block can be distinguished during top-level analysis. In other words, even though these blocks have the same internal components, each may have a potentially different connection to other blocks, top-level nets, and SI-ILMs. Such blocks can be uniquely re-named in top-level cell 424.

In step 426, an initial block level analysis for each block can be performed using wrapper cell 425. Note that because information regarding arrival/transition times is not available for wrapper cell 425 during an initial analysis, an infinite arrival time and zero transition can be assumed, thereby providing the most conservative timing estimate possible. Step 426 can generate a block SI-ILM 427 and annotation scripts 428. In one embodiment, annotation scripts 428 can include arrival/transition times for the internal nets of block SI-ILM 427 that are affected by cross-coupling (annotated at the input pins of the drivers of those internal nets, i.e. the aggressors in the top-level analysis).

Step 429 can use block SI-ILM 427, annotation scripts 428, and full chip parasitic information 422 to perform a top-level analysis. Additionally, as previously mentioned, top-level cell 424 can be used.

Optionally, if needed, step 430 can perform a refined block level analysis using the results of the top-level analysis as well as wrapper cell 425. Step 430 can be particularly beneficial if there were any violations in step 426. For example, in one embodiment, violations could be based on known timing paths and constraints. Note that if no violations were generated using the most conservative arrival/transition estimates in step 426, then the computed arrival/transition information, as generated in the top-level analysis (step 429), cannot cause a violation. Therefore, step 430 need only be performed if violations are detected in step 426.

If violations were detected in step 426, then step 430 can advantageously back-annotate the computed arrival and transition information for wrapper cell 425. At this point, the process can return to step 426. This iteration, in effect, replaces the most conservative arrival/transition estimates with the computed arrival/transition information, thereby decreasing the probability of violations.

The optional loop including steps 426, 429, and 430 can be repeated (each loop providing more accurate arrival/transition information) until step 426 generates no violations. Alternatively, the loop including steps 426, 429, and 430 can be repeated a predetermined number of times at which point the routing and/or design parameters can be changed to meet timing requirements.

Figure 5:
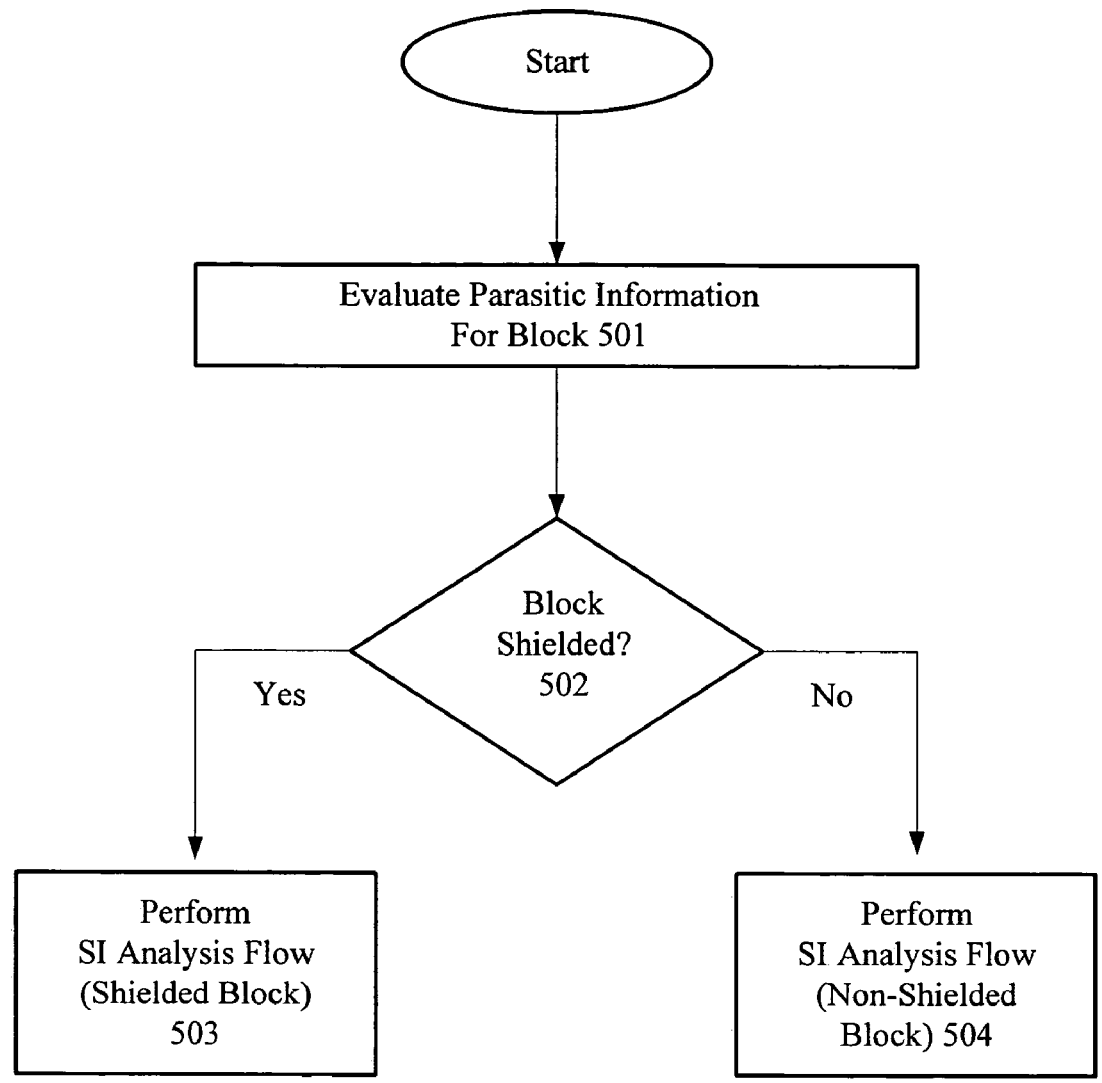
FIG. 5 illustrates an SI tool process flow that can determine whether shielded or non-shielded block analysis should be used.

In one embodiment, a user can specify whether blocks are shielded or non-shielded. In another embodiment, an SI analysis tool can evaluate the parasitic information provided by the user to determine whether blocks are shielded or non-shielded. For example, FIG. 5 illustrates an SI tool process flow 500 that can be used to provide this evaluation. In step 501, the SI analysis tool can evaluate the parasitic information for each block. As noted previously, a block can be defined as any user-defined hierarchy within a chip.

In step 502, the SI analysis tool can determine whether a block is shielded or non-shielded. In one embodiment, this determination can be based on the parasitic information provided with the design. For example, if the parasitic information does not include cross-coupling from nets external to the block to nets inside the block, then the block is shielded. At this point, SI analysis flow (shielded block) can be performed in step 503. In contrast, if the parasitic information includes cross-couplings from nets external to the block to nets inside the block, then the block is non-shielded. At this point, SI analysis flow (non-shielded) can be performed in step 504.

OTHER EMBODIMENTS

Although illustrative embodiments of the invention have been described in detail herein with reference to the figures, it is to be understood that the invention is not limited to those precise embodiments. They are not intended to be exhaustive or to limit the invention to the precise forms disclosed. For example, if limited memory prevents loading the full design and full chip parasitic information, e.g. non-shielded SI analysis flow 420 in FIG. 4D, then one or more blocks and their corresponding parasitic information can be used as inputs to step 423.

Note that in one embodiment, one set of blocks in the design could be analyzed using shielded blocks (FIG. 3A) and another set of blocks in the design could be analyzed using non-shielded blocks (FIG. 4D). A user can choose whether blocks are shielded or non-shielded based on routing congestion, complexity of analysis, desire to reuse blocks as multiple instances in the same design, desire to reuse the block in multiple designs, and/or other factors related to design constraints.

Further note that, depending on the cells in a block, the SI-ILM for that block may not contain any internal nets. In this case, the SI-ILM is the same as the ILM for the block.

As such, many modifications and variations will be apparent. Accordingly, it is intended that the scope of the invention be defined by the following claims and their equivalents.

The invention claimed is:

1. A method of performing hierarchical signal integrity (SI) analysis in conjunction with static timing analysis on a design, the method comprising:
   dividing the design into blocks;
   performing a block-level analysis for a block using cross-coupling effects on the block, thereby generating an SI interface logic model (ILM);
   performing a top-level analysis for the design using the SI-ILM;
   determining a cross-coupling effect of an interface net in the block on an internal net of the block; and
   determining a cross-coupling effect of an external net to the block on an internal net of the block.

2. A method of performing signal integrity (SI) analysis of a design with non-shielded blocks of an integrated circuit, the method comprising:
   receiving block information regarding the design and parasitic information regarding that design; and
   for each block,
      generating a wrapper cell including block information, an SI context for the block, and parasitic information for the block, wherein the SI context includes nets external to the block that are cross-coupled to internal nets and interface nets of the block;
      generating an SI interface logic model (ILM) using the wrapper cell, the SI-ILM including internal nets cross-coupled to nets external to the block; and
      performing top-level analysis of the block using the SI-ILM.

3. The method of claim 2, wherein, for each internal net in the wrapper cell, an arrival time is defined to be infinite and a transition time is defined to be zero.

4. The method of claim 2, further comprising generating annotation scripts for cells in the wrapper cell, wherein performing the block-level analysis includes using the annotation scripts.

5. The method of claim 4, wherein dividing the design into blocks comprises generating a top-level cell description, the top-level cell description uniquely identifying blocks having multiple instantiations, and wherein performing the top-level analysis includes using the top-level cell description.

6. The method of claim 4, wherein if a violation occurs when performing block-level analysis, then further including the steps of:
   re-performing the block-level analysis by using the wrapper cell and results from the top-level analysis;
   re-generating a revised SI-ILM; and
   performing top-level analysis of the block using the revised SI-ILM.

7. The method of claim 4, wherein performing top-level analysis of the block includes using the parasitic information regarding the design.

* * * * *